(12) United States Patent
Margalit et al.

(10) Patent No.: US 12,724,449 B2
(45) **Date of Patent: *Sep. 1, 2026**

(54) ASYNCHRONOUS ASIC

(71) Applicant: Magic Leap, Inc., Plantation, FL (US)

(72) Inventors: Niv Margalit, Ramat-Hasharon (IL); Eyal Sela, Ramat-Hasharon (IL)

(73) Assignee: Magic Leap, Inc., Plantation, FL (US)

( * ) Notice: Subject to any disclaimer, the term of this patent is extended or adjusted under 35 U.S.C. 154(b) by 121 days.

This patent is subject to a terminal disclaimer.

(21) Appl. No.: 18/773,471

(22) Filed: Jul. 15, 2024

(65) Prior Publication Data

US 2024/0370051 A1 Nov. 7, 2024

Related U.S. Application Data

(63) Continuation of application No. 18/358,623, filed on Jul. 25, 2023, now Pat. No. 12,135,580, which is a continuation of application No. 18/175,466, filed on Feb. 27, 2023, now Pat. No. 11,747,856, which is a continuation of application No. 17/950,808, filed on Sep. 22, 2022, now Pat. No. 11,619,965, which is a continuation of application No. 17/288,457, filed as (Continued)

(51) Int. Cl.

| | |
|---|---|
| ***G06F 1/12*** | (2006.01) |
| ***G06F 1/06*** | (2006.01) |
| ***G06F 1/10*** | (2006.01) |
| ***H03L 7/081*** | (2006.01) |

(52) U.S. Cl.

CPC .................. *G06F 1/12* (2013.01); *G06F 1/06* (2013.01); *G06F 1/10* (2013.01); *H03L 7/0816* (2013.01)

(58) Field of Classification Search

CPC .................................... G06F 1/12; G06F 1/10

See application file for complete search history.

(56) References Cited

U.S. PATENT DOCUMENTS 4,852,988 A 8/1989 Velez
5,317,601 A 5/1994 Riordan et al.

(Continued)

FOREIGN PATENT DOCUMENTS

CA 2316473 A1 1/2001
CA 2362895 A1 12/2002

(Continued)

OTHER PUBLICATIONS

Chinese Notice of Allowance dated Jul. 12, 2024, for CN Application No. 201980085678.5, with English translation, 4 pages.

(Continued)

*Primary Examiner* — Phil K Nguyen

(74) *Attorney, Agent, or Firm* — Zi Y. Wong; Via LLP

(57) ABSTRACT

An electronic device is disclosed. The electronic device comprises a first clock configured to operate at a frequency. First circuitry of the electronic device is configured to synchronize with the first clock. Second circuitry is configured to determine a second clock based on the first clock. The second clock is configured to operate at the frequency of the first clock, and is further configured to operate with a phase shift with respect to the first clock. Third circuitry is configured to synchronize with the second clock.

20 Claims, 6 Drawing Sheets

Related U.S. Application Data application No. PCT/US2019/057723 on Oct. 23, 2019, now Pat. No. 11,487,316.

(60) Provisional application No. 62/750,180, filed on Oct. 24, 2018.

(56) References Cited

U.S. PATENT DOCUMENTS

| | | | |
|---|---|---|---|
| 5,604,452 | A | 2/1997 | Huang |
| 6,433,760 | B1 | 8/2002 | Vaissie |
| 6,491,391 | B1 | 12/2002 | Blum et al. |
| 6,847,336 | B1 | 1/2005 | Lemelson |
| 6,943,754 | B2 | 9/2005 | Aughey |
| 6,977,776 | B2 | 12/2005 | Volkenandt et al. |
| 7,284,143 | B2 | 10/2007 | Song |
| 7,347,551 | B2 | 3/2008 | Fergason et al. |
| 7,433,439 | B1 | 10/2008 | Richmond |
| 7,488,294 | B2 | 2/2009 | Torch |
| 7,551,651 | B1 | 6/2009 | Yen |
| 8,235,529 | B1 | 8/2012 | Raffle |
| 8,611,015 | B2 | 12/2013 | Wheeler |
| 8,638,498 | B2 | 1/2014 | Bohn et al. |
| 8,696,113 | B2 | 4/2014 | Lewis |
| 8,929,589 | B2 | 1/2015 | Publicover et al. |
| 9,010,929 | B2 | 4/2015 | Lewis |
| 9,274,338 | B2 | 3/2016 | Robbins et al. |
| 9,292,973 | B2 | 3/2016 | Bar-zeev et al. |
| 9,323,325 | B2 | 4/2016 | Perez et al. |
| 9,720,505 | B2 | 8/2017 | Gribetz et al. |
| 10,013,053 | B2 | 7/2018 | Cederlund et al. |
| 10,025,379 | B2 | 7/2018 | Drake et al. |
| 10,432,209 | B1 | 10/2019 | Mikes et al. |
| 11,487,316 | B2 | 11/2022 | Margalit et al. |
| 11,619,965 | B2 | 4/2023 | Margalit et al. |
| 11,747,856 | B2 | 9/2023 | Margalit et al. |
| 12,135,580 | B2 | 11/2024 | Margalit et al. |
| 2003/0030597 | A1 | 2/2003 | Geist |
| 2003/0043926 | A1 | 3/2003 | Terashima et al. |
| 2003/0099253 | A1 | 5/2003 | Kim |
| 2003/0223522 | A1 | 12/2003 | Fukushima |
| 2004/0015734 | A1 | 1/2004 | Rahman |
| 2004/0212742 | A1 | 10/2004 | Tanigawa |
| 2005/0201163 | A1 | 9/2005 | Reichel et al. |
| 2005/0201191 | A1 | 9/2005 | Goller et al. |
| 2005/0232029 | A1 | 10/2005 | Mahr et al. |
| 2005/0270073 | A1 | 12/2005 | Lee et al. |
| 2006/0023158 | A1 | 2/2006 | Howell et al. |
| 2008/0034192 | A1 | 2/2008 | Lin et al. |
| 2008/0094117 | A1 | 4/2008 | Stoler et al. |
| 2008/0159444 | A1* | 7/2008 | Terada .................. H04L 7/0338 375/316 |
| 2008/0232179 | A1 | 9/2008 | Kwak |
| 2009/0167349 | A1 | 7/2009 | Madurawe et al. |
| 2009/0240969 | A1 | 9/2009 | Chiu |
| 2011/0175653 | A1 | 7/2011 | Tani et al. |
| 2011/0211056 | A1 | 9/2011 | Publicover et al. |
| 2011/0213664 | A1 | 9/2011 | Osterhout |
| 2011/0296265 | A1 | 12/2011 | Rakheja et al. |
| 2012/0021806 | A1 | 1/2012 | Maltz |
| 2013/0077147 | A1 | 3/2013 | Efimov |
| 2013/0106475 | A1 | 5/2013 | Lin et al. |
| 2013/0170591 | A1 | 7/2013 | Su |
| 2014/0035636 | A1 | 2/2014 | Toda |
| 2014/0195918 | A1 | 7/2014 | Friedlander |
| 2015/0168731 | A1 | 6/2015 | Robbins |
| 2016/0013927 | A1 | 1/2016 | Lee |
| 2016/0141017 | A1 | 5/2016 | Lin et al. |
| 2016/0308666 | A1 | 10/2016 | Mekhiel |
| 2018/0017988 | A1 | 1/2018 | Kommrusch et al. |
| 2023/0018203 | A1 | 1/2023 | Margalit et al. |
| 2023/0205257 | A1 | 6/2023 | Margalit et al. |
| 2023/0367361 | A1 | 11/2023 | Margalit |

FOREIGN PATENT DOCUMENTS

| | | | |
|---|---|---|---|
| CA | 2388766 | A1 | 12/2003 |
| JP | 05-260029 | A | 10/1993 |
| JP | 2003224550 | A | 8/2003 |
| JP | 2006-332919 | A | 12/2006 |
| JP | 2010-045458 | A | 2/2010 |
| JP | 2010-517345 | A | 5/2010 |
| JP | 2015-001832 | A | 1/2015 |
| JP | 2015-015540 | A | 1/2015 |

OTHER PUBLICATIONS

Chinese Office Action dated Feb. 1, 2024, for CN Application No. 201980085678.5, with English translation, nine pages.

European Office Action dated Sep. 15, 2023, for EP Application No. 19874942.6, seven pages.

European Search Report dated Nov. 25, 2021, for EP Application No. 19874942.6, ten pages.

Ferretti, M. et al. "High Performance Asynchronous ASIC Back-End Design Flow Using Single-Track Full-Buffer Standard Cells," In: Proceedings 10th International Symposium on Asynchronous Circuits and Systems, May 18, 2004, retrieved on Dec. 14, 2019, from http://async.usc.edu/Jungfrau_web/htdocs/recent_pub/MF_ASYNC04 .pdf, entire document.

International Search Report and Written Opinion mailed Jan. 17, 2020, for PCT Application No. PCT/US2019/057723, filed Oct. 23, 2019, eight pages.

Jacob, R. "Eye Tracking in Advanced Interface Design", Virtual Environments and Advanced Interface Design, Oxford University Press, Inc. (Jun. 1995).

Japanese Notice of Allowance mailed Aug. 22, 2024, for JP Application No. 2022-164507, with English translation, 6 pages.

Japanese Notice of Allowance mailed Jul. 30, 2024, for JP Application No. 2021-522076, with English translation, 6 pages.

Japanese Notice of Allowance mailed Sep. 19, 2024, for JP Application No. 2024-040843, with English translation, 6 pages.

Japanese Office Action mailed Dec. 20, 2023, for JP Application No. 2022-164507, with English translation, five pages.

Japanese Office Action mailed Mar. 4, 2024, for JP Application No. 2021-522076, with English translation, eight pages.

Japanese Office Action mailed May 22, 2024, for JP Application No. 2022-164507, with English translation, five pages.

Japanese Office Action mailed Oct. 13, 2023, for JP Application No. 2021-522076, with English translation, 7 pages.

John Teife, ED—Larry Sanson: "Asynchronous Cryptographic Hardware Design", Carnahan Conferences Security Technology, Proceedings 2006 40th Annual IEEE International, IEEE, PI, Oct. 1, 2006, pp. 221-227.

Non-Final Office Action mailed Feb. 29, 2024, for U.S. Appl. No. 18/358,623, filed Jul. 25, 2023, ten pages.

Non-Final Office Action mailed May 25, 2022, for U.S. Appl. No. 17/288,457, filed Apr. 23, 2021, twelve pages.

Notice of Allowance mailed Aug. 24, 2022, for U.S. Appl. No. 17/288,457, filed Apr. 23, 2021, six pages.

Notice of Allowance mailed Jan. 25, 2023, for U.S. Appl. No. 17/950,808, filed Sep. 22, 2022, ten pages.

Notice of Allowance mailed Jun. 13, 2024, for U.S. Appl. No. 18/358,623, filed Jul. 25, 2023, five pages.

Notice of Allowance mailed Jun. 28, 2023, for U.S. Appl. No. 18/175,466, filed Feb. 27, 2023, ten pages.

Rolland, J. et al., "High-resolution inset head-mounted display", Optical Society of America, vol. 37, No. 19, Applied Optics, (Jul. 1, 1998).

Tanriverdi, V. et al. (Apr. 2000). "Interacting With Eye Movements In Virtual Environments," Department of Electrical Engineering and Computer Science, Tufts University, Medford, MA 02155, USA, Proceedings of the SIGCHI conference on Human Factors in Computing Systems, eight pages.

Yoshida, A. et al., "Design and Applications of a High Resolution Insert Head Mounted Display", (Jun. 1994).

European Notice of Allowance dated Jun. 6, 2025, for EP Application No. 19874942.6, 4 pages.

(56) References Cited

OTHER PUBLICATIONS

Japanese Office Action mailed Jul. 2, 2025, for JP Application No. 2024-153947, with English translation, 5 pages.

* cited by examiner

ASYNCHRONOUS ASIC

CROSS-REFERENCE TO RELATED APPLICATIONS

This application is a continuation of U.S. application Ser. No. 18/358,623, filed Jul. 25, 2023, which is a continuation of U.S. application Ser. No. 18/175,466, filed Feb. 27, 2023, now U.S. Pat. No. 11,747,856, issued Sep. 5, 2023, which is a continuation of U.S. application Ser. No. 17/950,808, filed Sep. 22, 2022, now U.S. Pat. No. 11,619,965, issued Apr. 4, 2023, which is a continuation of U.S. application Ser. No. 17/288,457, filed Apr. 23, 2021, now U.S. Pat. No. 11,487, 316, issued Nov. 1, 2022, which is a national stage application under 35 U.S.C. § 371 of International Application No. PCT/US2019/057723, filed internationally on Oct. 23, 2019, which claims priority to U.S. Provisional Application No. 62/750,180, filed on Oct. 24, 2018, the contents of which are incorporated by reference herein in their entirety.

FIELD

This disclosure relates to electronic circuits, and in particular to systems and methods for providing clock signals to components of electronic devices.

BACKGROUND

Almost all digital logic devices make use of clock signals to trigger or control timed behaviors of electronic components of those devices. For example, a clock signal provided to a clock input of a register will cause the register to propagate a data input to a data output. At a low level, a clock signal (e.g., a periodic digital logic signal alternating between a logical one and a logical zero) may cause one or more semiconductive devices (e.g., a transistors of a register) to toggle from a conductive state to a non-conductive state, or vice versa.

In devices including an Application Specific Integrated Circuit (ASIC), the ASIC may be considered to include discrete functional units, or "blocks," with registers of each block synchronized to a local clock of the block. A block may include circuitry (including programmable logic circuitry) configured to perform one or more functions associated with the block. In so-called synchronous circuit designs, two or more blocks may be synchronized to the same global clock in a single "clock domain." By synchronizing blocks within a clock domain, synchronous circuits can avoid problems common to using multiple independent local clocks-namely, clock drift that can require inefficient rebuffering operations to correct. However, by simultaneously providing the same clock signal to multiple blocks, synchronous circuits can experience unwanted higher order effects, such as resonant circuit noise caused by large numbers of transistors toggling at once ("transistor resonance"). For modern digital devices, the number of such transistors can be staggering—on the order of tens of billions for some devices—and the resulting resonant circuit noise can become quite significant. Moreover, these unwanted effects may be amplified as clock frequency increases. It is desirable to utilize a clocking scheme that maintains the advantages of synchronized clocks while avoiding the unwanted noise they can introduce. As described herein, this can be achieved by dividing clock domains into "phase-shifted-clock domains" that exchange data asynchronously, but are synchronized to "phase-shifted-clocks" derived from a common reference clock.

BRIEF SUMMARY

Systems and methods for presenting a clock signal in a digital device are disclosed. In some examples, an electronic device is disclosed which comprises a first clock configured to operate at a frequency. First circuitry of the electronic device is configured to synchronize with the first clock. Second circuitry is configured to determine a second clock based on the first clock. The second clock is configured to operate at the frequency of the first clock, and is further configured to operate with a phase shift with respect to the first clock. Third circuitry is configured to synchronize with the second clock.

DETAILED DESCRIPTION

In the following description of examples, reference is made to the accompanying drawings which form a part hereof, and in which it is shown by way of illustration specific examples that can be practiced. It is to be understood that other examples can be used and structural changes can be made without departing from the scope of the disclosed examples.

Figure 1:
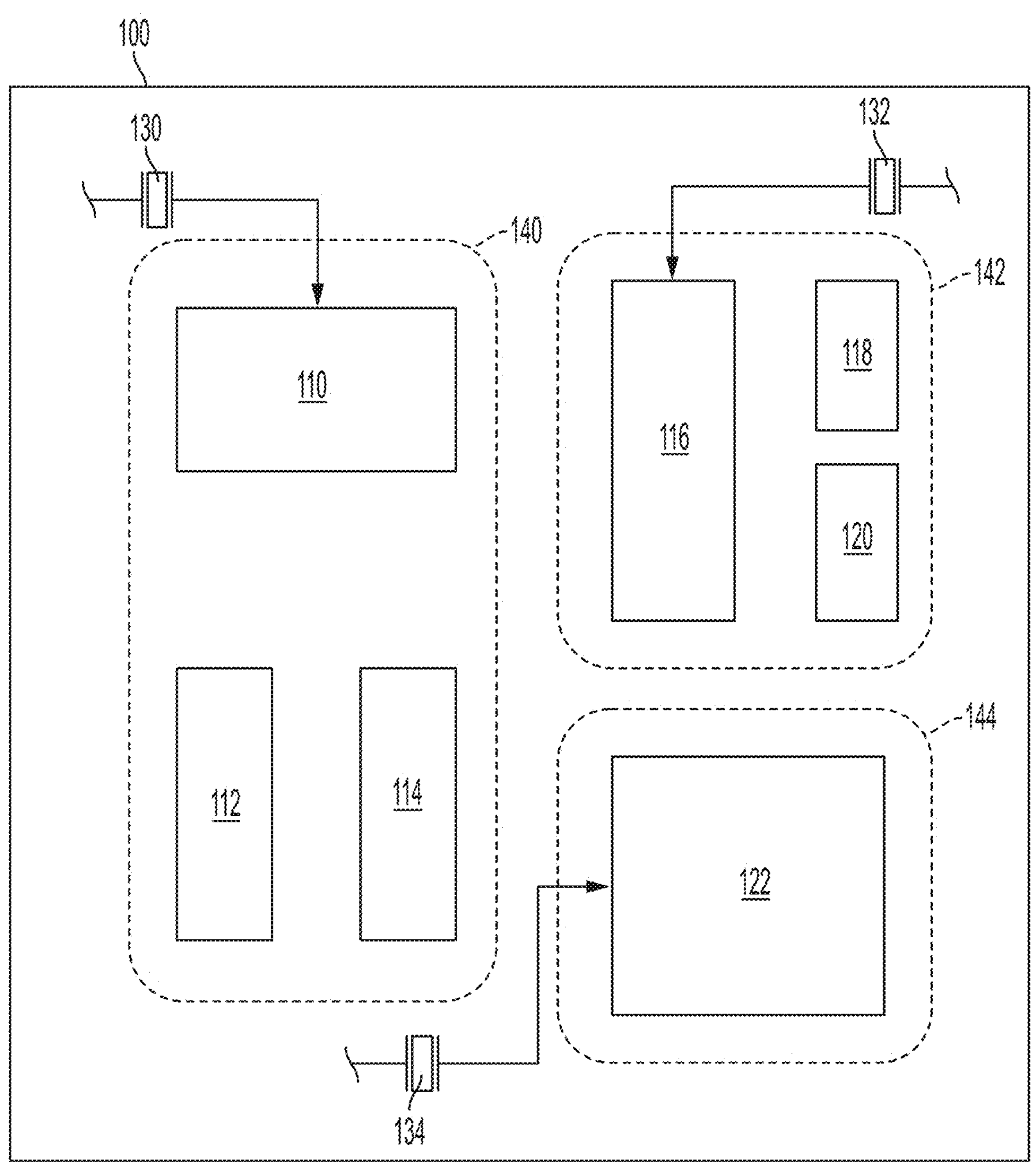
FIG. 1 illustrates an example electronic device with blocks grouped into clock domains, according to some embodiments.

FIG. 1 illustrates a high-level diagram of an ASIC 100, according to some embodiments. The ASIC 100 includes seven functional blocks 110, 112, 114, 116, 118, 120, and 122; three reference clocks 130, 132, and 134; and three clock domains 140; 142; and 144 (which are synchronized to reference clocks 130, 132, and 134, respectively). As shown in FIG. 1, the three clock domains (140, 142, 144) are shared among the seven blocks of ASIC 100 (110, 112, 114, 116, 118, 120, 122) such that multiple blocks (e.g., blocks 110, 112, 114) are synchronized to the same clock domain (e.g., clock domain 140). Blocks synchronized to the same clock domain enjoy benefits such as the elimination of clock drift (obviating the need to synchronize blocks to independent clocks). In such systems, data can be transmitted synchronously between two blocks within the same clock domains (e.g., between block 110 and block 112 in the example).

However, synchronizing multiple blocks (e.g., blocks 110, 112, 114) to the same clock domain (e.g., clock domain 140) can introduce its own problems. For example, propagation delays are incurred by data signals sent from a transmitting block (e.g., block 110) to a receiving block (e.g., block 112), for example, due in part to lengths of wires connecting the transmitting block and the receiving block, and these signals may not all reach their respective destinations in the receiving block at the same time (due in part to different lengths of wire that carry these signals). Correcting for such timing errors introduces overhead and complexity; for instance, data signals may need to be buffered along a transmission path as they propagate from the transmitting block to the receiving block, and the buffering process generally increases power consumption of a digital logic device including the transmitting block and the receiving block. Worse, the need for buffering increases with the size and complexity of digital logic devices, which increasingly call for greater numbers of blocks and thinner wires for inter-chip communication.

Furthermore, synchronizing multiple blocks of a digital logic device within a single clock domain means that the conductive state transition activity of semiconductive devices within those blocks will be synchronized. For example, all transistors of blocks within the same clock domain (e.g., blocks 110, 112, 114 within clock domain 140) may change state at the same time. The resulting resonance can introduce unwanted digital noise that scales with the size, complexity, and transistor density of the ASIC 100. While such noise may be reduced by adding noise isolation to the ASIC blocks, adding noise isolation generally introduces unwanted power consumption and can present undesirable layout and design constraints. It would be desirable to stagger, within a single clock domain, the times at which such transistors transition between on and off states.

Accordingly, a need to rebuffer data signals transmitted between two ASIC blocks synchronized to the same clock domain may be reduced, in order to reduce the power consumption and complexity of the ASIC. Further, noise caused by synchronized toggling of semiconductors within a single clock domain may be reduced. Moreover, these objectives may be accomplished while retaining the benefits (e.g., simplicity, reliability) of synchronizing multiple ASIC blocks to a single reference clock within a single clock domain.

In some embodiments, this may be achieved by generating, within a single clock domain synchronized to a single reference clock, one or more phase-shifted-clocks from the reference clock; and by coupling each phase-shifted-clock to a subset of the registers within that phase-shifted-clock domain. Phase-shifted-clocks generated from a reference clock can share the same frequency as the reference clock, but operate with a phase shift relative to the reference clock. Because phase-shifted-clocks are generated from the same reference clock, and operate at the same frequency as the reference clock, no clock drift occurs between two phase-shifted-clocks within the same phase-shifted-clock domain, or between a phase-shifted-clock and its reference clock. Registers within a clock domain can be divided into subgroups ("phase-shifted-clock domains"), with each subgroup clocked to a phase-shifted-clock; the phase shift of each phase-shifted-clock determines when the transistors of its corresponding registers change state with respect to the reference clock. These state change times can be staggered by a circuit designer to achieve desired "load balancing." Load balancing may reflect the designer's efforts to control the toggling peaks of the design. For example, ASICs in which many or all registers toggle at the same moment may experience high peaks of current from a power supply, and a high levels of noise. But by synchronizing ASIC blocks to phase-shifted clocks such that large groups of registers do not toggle at the same moment, lower peak currents from the power supply, and lower noise, can be realized.

Figure 2:
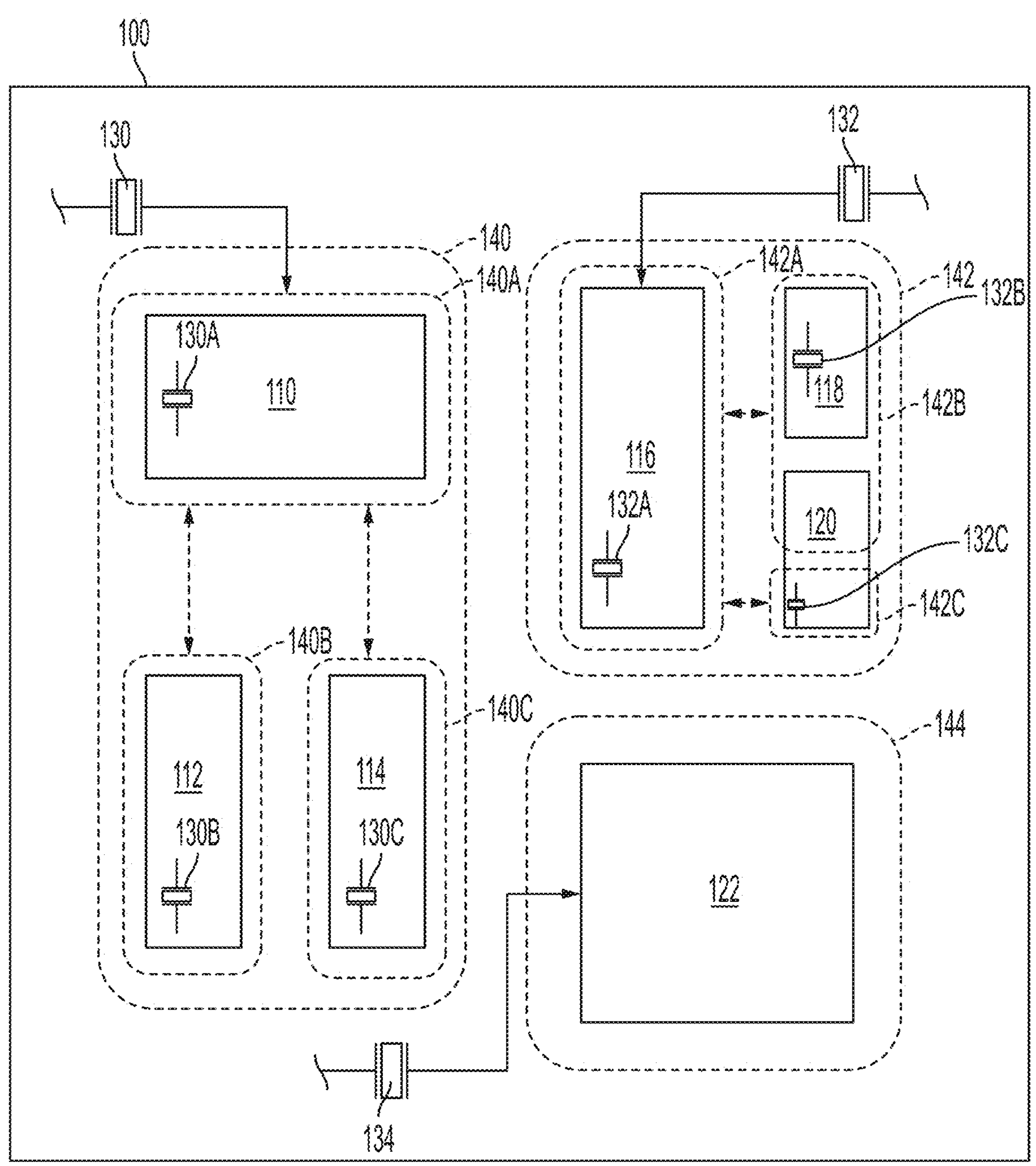
FIG. 2 illustrates an example electronic device with blocks grouped into clock domains and phase-shifted-clock domains, according to some embodiments.

FIG. 2 illustrates an example of dividing the clock domains of example ASIC 100 into phase-shifted-clock domains, according to some embodiments. As illustrated in FIG. 2, clock domain 140 (synchronized to reference block 130) is subdivided into three phase-shifted-clock domains: 140A, 140B, and 140C. Phase-shifted-clock domain 140A can be synchronized to phase-shifted-clock 130A; phase-shifted-clock domain 140B can be synchronized to phase-shifted-clock 130B; and phase-shifted-clock domain 140C can be synchronized to a phase-shifted-clock 130C, where phase-shifted-clocks 130A, 130B, and 130C are derived from reference clock 130 and operate at the same frequency as reference clock 130. Similarly, in the example, clock domain 142 is subdivided into phase-shifted-clock domains 142A, 142B, and 142C and synchronized to phase-shifted-clocks 132A, 132B, and 132C, respectively, which phase-shifted-clocks are derived from reference clock 132. Not all clock domains need be divided into phase-shifted-clock domains; for instance, in the example shown, clock domain 144 is not divided into phase-shifted-clock domains and remains synchronized to reference clock 134.

ASIC blocks may be synchronized to one or more phase-shifted-clock domains. For instance, in the example shown in FIG. 2, block 110 is synchronized to phase-shifted-clock domain 140A; block 112 is synchronized to phase-shifted-clock domain 140B; and block 114 is synchronized to phase-shifted-clock domain 140C. In some cases, two or more ASIC blocks can be synchronized to a single phase-shifted-clock domain. Further, two or more portions (e.g., groupings of components or registers) of a single ASIC block can be synchronized to different phase-shifted-clock domains. For instance, as shown, a first portion of block 120 is synchronized to phase-shifted-clock domain 142B, and a second portion of block 120 is synchronized to phase-shifted-clock domain 142C. A circuit designer can partition ASIC blocks, or regions of ASIC blocks, into phase-shifted-clock domains based on the design considerations of the particular application.

Phase-shifted-clocks can be generated using various techniques known in the art for generating a clock from a reference clock. For example, a delay-locked loop (DLL) can be used to generate a phase-shifted-clock (e.g., phase-shifted-clock 130A) as a phase-shifted version of a reference clock (e.g., reference clock 130), with the same frequency as the reference clock.

Figure 3:
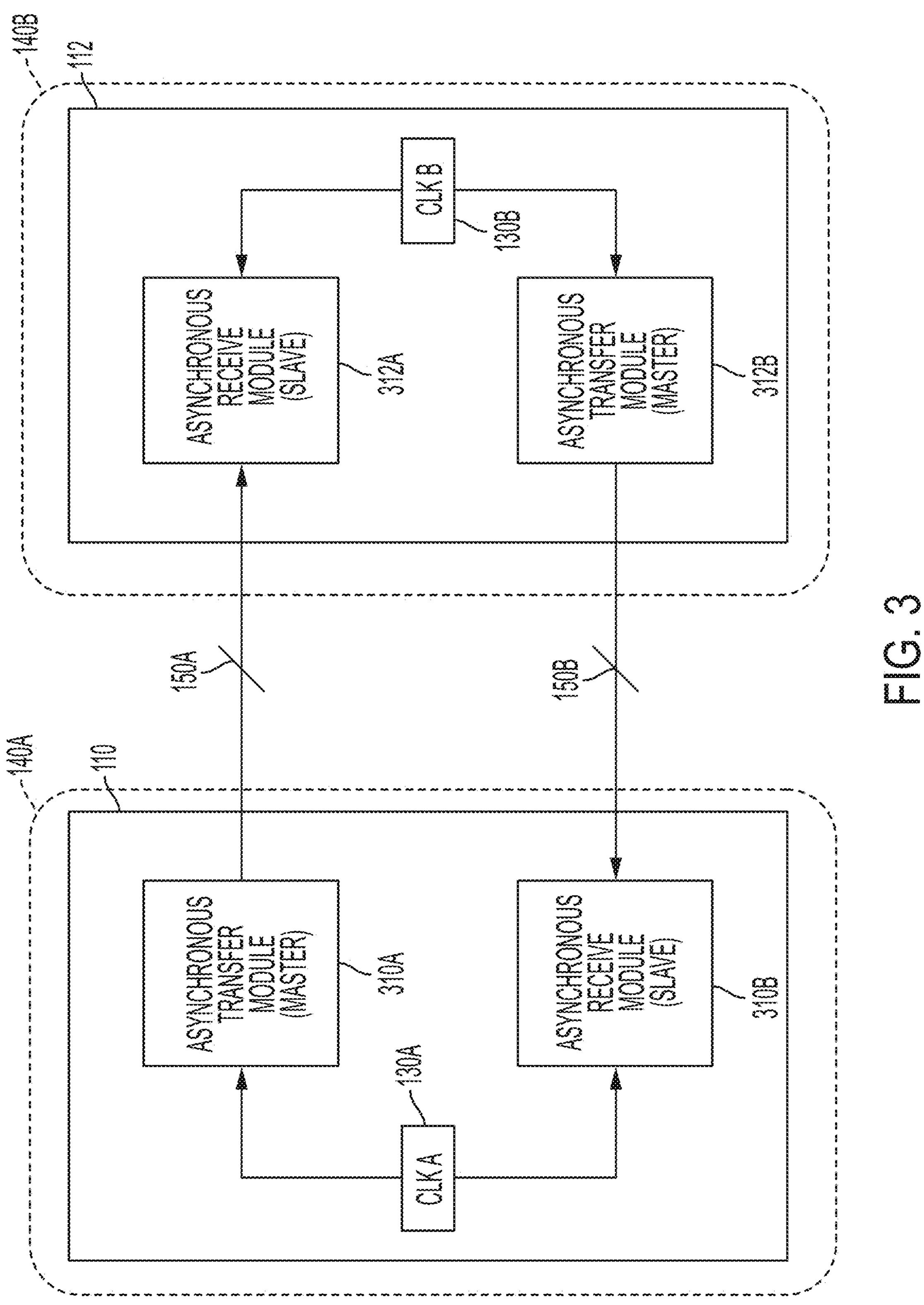
FIG. 3 illustrates an example of two phase-shifted-clock domains of an electronic device configured to exchange data, according to some embodiments.

FIG. 3 illustrates an example of two phase-shifted-clock domains of an ASIC, such as example ASIC 100, configured to asynchronously exchange data, according to some embodiments. As illustrated in FIG. 3, block 110 (synchronized to phase-shifted-clock domain 140A) asynchronously exchanges data with block 112 (synchronized to phase-shifted-clock domain 140B). Block 110 includes an asynchronous transfer module 310A for transmitting data and/or control signals to block 112 via bus 150A, and block 112 includes an asynchronous receive module 312A for receiving the data from block 110 (via transfer module 310A). Modules 310A and 312A can be arranged in a master/slave configuration, with module 310A configured as the master and module 312A configured as the slave. Similarly, in examples where block 112 is configured to send data and block 110 is configured to receive data, block 112 can include an asynchronous transfer module 312B for transmitting data and/or control signals to block 110 via bus 150B (which in some examples may be the same as bus 150A), and block 110 can include an asynchronous receive module 310B for receiving the data from block 112 (via transfer module 312B). Modules 312B and 310B can be arranged in a master/slave configuration, with module 312B configured as the master and module 310B configured as the slave. The transfer/receive modules of each block are clocked to the phase-shifted-clock of its respective phase-shifted-clock domain: for example, transfer module 310A and receive module 310B of block 110 are clocked to phase-shifted-clock 130A, and transfer module 312B and receive module 312A of block 112 are clocked to phase-shifted-clock 130B. (In some examples, transfer modules and receive modules, such as described herein, need not be discrete units, and may overlap or share common components.)

Data buses 150A and/or 150B can carry data and/or control signals in any suitable configuration. Various problems can be introduced when data crosses asynchronously between clock domains or phase-shifted-clock domains. For instance, data on the buses 150A/150B risk becoming incoherent, such as if data from one "lane" of the data bus arrives at the receiving end sooner or later than expected (for instance, due to differences in the length of electrical trace that data in each lane must travel). Additionally, data transmitted from a transmitting phase-shifted-clock domain may be lost if it is not captured within the receiving phase-shifted-clock domain due to data instability. Such phase-shifted-clock domain crossing problems can lead to functional errors in the receiving phase-shifted-clock domain. Various suitable technologies for addressing clock domain crossing can be adapted to phase-shifted-clock domain crossing.; one example system for handling phase-shifted-clock domain crossing issues is a first-in-first-out (FIFO) buffer such as described below. Clock domain crossing logic can be implemented, for example, wholly or partially within asynchronous receive module 312A of block 112; within asynchronous transfer module 310A of block 110; within asynchronous receive module 310B of block 110; within asynchronous transfer module 312B of block 112; within circuitry sitting between block 110 and block 112; or in any other suitable location or combination of locations.

Figure 4:
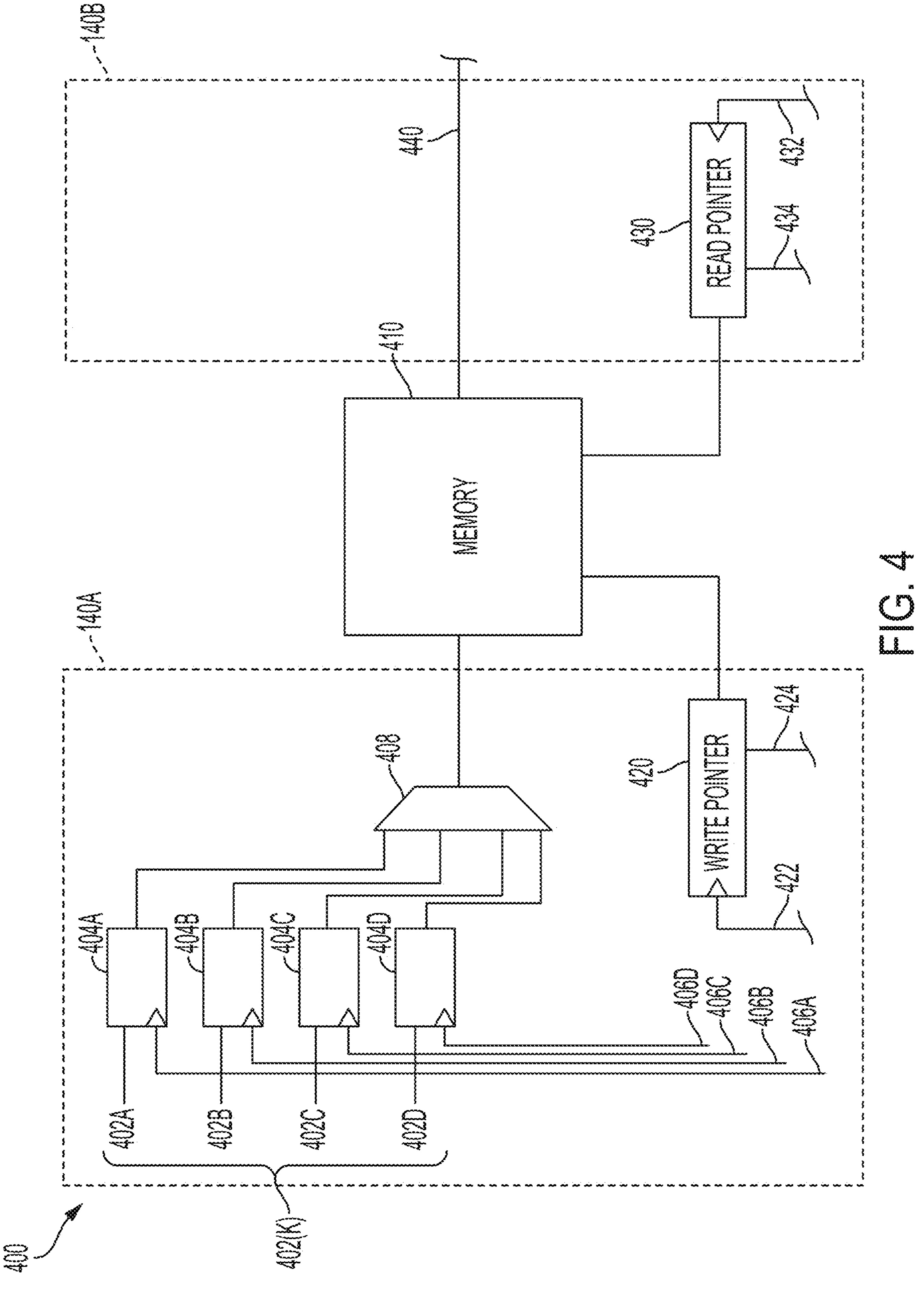
FIG. 4 illustrates an example first-in-first-out (FIFO) buffer configured for transfer of data between two phase-shifted-clock domains of an electronic device, according to some embodiments.

FIG. 4 illustrates a portion of an example FIFO buffer 400 configured to hand off data between phase-shifted-clock domains of an ASIC, such as phase-shifted-clock domains 140A and 140B in example ASIC 100, according to some embodiments. In some examples, FIFO buffer 400 can be implemented wholly or partially within asynchronous receive module 312A of block 112; within asynchronous transfer module 310A of block 110; within asynchronous receive module 310B of block 110; within asynchronous transfer module 312B of block 112; within circuitry sitting between block 110 and block 112; or in any other suitable location or combination of locations. As illustrated in FIG. 4, input 402 (shown in the figure as 402(K)) is data transmitted to FIFO buffer 400; for instance, input 402 may correspond to data transmitted via one or more wires of bus 150A from block 110 to block 112 as shown in FIG. 3. In the example shown, input 402 has a width K of four bits, the four bits shown as 402A, 402B, 402C, and 402D (which may correspond to a number K of wires of bus 150A). However, the value of K may correspond to any suitable data width. Each of bits 402A through 402D is presented as input to a respective register 404A through 404D. Registers 404A through 404D are each clocked by a respective lane clock 406A through 406D. Each lane clock 406A through 406D is a phase-shifted-clock, selected as described below for the respective register 404A through 404D. Lane clocks 406A through 406D advance data bits 402A through 402D, respectively, through registers 404A through 404D, respectively, to multiplexer 408. Generally, the number of registers 404, the number of lane clocks 406, and the number of inputs to multiplexer 408 will all be equal to the data width K of input 402 (in this example, four, although any suitable data width can be used).

Lane clocks 406A through 406D are selected such that input bits 402A through 402D arrive at the inputs of multiplexer 408 in an aligned sequence corresponding to their bit position within input 402. Lane clocks 406A through 406D can be generated from a reference clock (e.g., reference clock 130) and selected as described below with respect to FIGS. 5 and 6. With bits 402A through 402D arriving at multiplexer 408 in an aligned sequence, multiplexer 408 can write the aligned data to memory 410 (which may include RAM or any other suitable type of storage). The aligned data can be read from memory 410 as data 440. The specifics of memory 410 can be chosen as suitable for the application at hand; for instance, an example memory 410 could include storage sufficient to store ten stages for each data bit 402A through 402D.

The write address for writing input 402 to memory 410 can be controlled by write pointer 420, which can be sequentially advanced by write clock 422 while write enable 424 is active. Similarly, the read address for reading data 440 from memory 410 can be controlled by read pointer 430, which can be sequentially advanced by read clock 432 while read enable 434 is active. In the example, write clock 422 belongs to phase-shifted-clock domain 140A, while read clock 432 belongs to phase-shifted-clock domain 140B. Phase-shifted-clock domain 140A (and therefore write clock 422) may be synchronized to phase-shifted-clock 130A; while phase-shifted-clock domain 140B (and therefore read clock 432) may be synchronized to phase-shifted-clock 130B. As described above, one or more of phase-shifted-clock 130A and phase-shifted-clock 130B may be synchronized to reference clock 130; while another one or more of phase-shifted-clock 130A and phase-shifted-clock 130B may be a phase-shifted version of reference clock 130 (though operating at the same frequency as reference clock 130). Accordingly, FIFO buffer 400 presents an example of transmitting data from a first block (e.g., 110) in a first phase-shifted-clock domain (e.g., 140A) to a second block (e.g., 112) in a second phase-shifted-clock domain (e.g., 140B). Further, data can be transmitted in the reverse direction (i.e., block 112 to block 110 via bus 150B) in an analogous manner.

Lane clocks 406A through 406D, write clock 422, and read clock 432 correspond to phase-shifted-clocks generated from a reference clock (e.g., reference clock 130), such as described above. Write clock 422 may correspond to phase-shifted-clock 130A described above (to which phase-shifted-clock domain 140A is synchronized); and read clock 342 may correspond to phase-shifted-clock 130B described above (to which phase-shifted-clock domain 140B is synchronized). In some examples, lane clocks 406A through 406D, write clock 422, and read clock 432 can be selected from one or more of phase-shifted-clock "candidates," where each phase-shifted-clock candidate is generated (e.g., via a DLL) from a reference clock; shares the frequency of the reference clock; and differs from other phase-shifted-clock candidates in phase shift relative to the reference clock.

Figure 5:
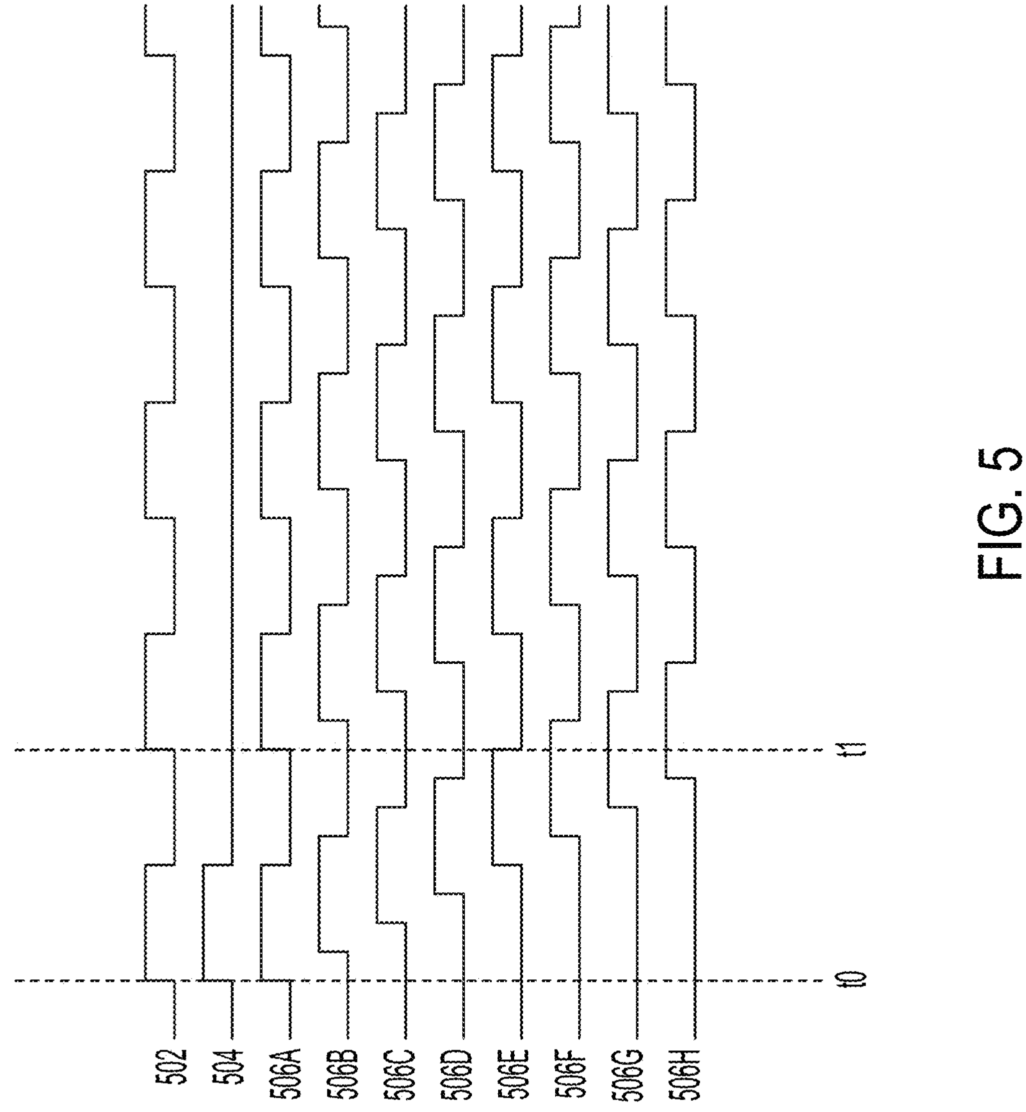
FIG. 5 illustrates an example of generating phase-shifted-clocks from a reference clock, according to some embodiments.

FIG. 5 illustrates an example of generating phase-shifted-clocks from a reference clock, according to some embodiments. A DLL can accept as input a reference clock 502 (which may correspond to, for example, reference clock 130) having a period T, and output N phase-shifted-clock candidates (e.g., the eight clock signals 506A through 506H). The number N of phase-shifted clock candidates may, but need not, be equal to the number of lane clocks (e.g., 406A through 406D). In the example shown in FIG. 5, each of phase-shifted-clock candidates 506A through 506H is shifted in phase by a multiple of T/N with respect to the reference clock 502. For example, if reference clock 502 has a period of 24 ns (e.g., a time difference between t0 and t1 in FIG. 5), and N is 8 as shown in the example, phase-shifted-clock candidate 506A may have a phase shift of 0 ns (i.e., 0*24/8 ns); phase-shifted-clock candidate 506B may have a phase shift of 3 ns (i.e., 1*24/8 ns); phase-shifted-clock candidate 506C may have a phase shift of 6 ns (i.e., 2*24/8 ns); and so on. Techniques for using a DLL to generate phase shifted clocks (e.g., phase-shifted-clock candidates 506A through 506H) from a reference clock will be familiar to those skilled in the art. T is the reciprocal of the reference clock frequency, and the number N can be selected by a circuit designer based on considerations such as the desired accuracy, latency and complexity requirements, and the reference clock frequency. For instance, a greater number N of phase-shifted-clock candidates can potentially result in lower latency (because a more suitable phase-shifted-clock candidate can potentially be selected) at the expense of complexity.

Once phase-shifted-clock candidates 506A through 506H have been generated, a lane clock (e.g., 406A through 406D) can be selected for each bit of input data (e.g., K bits 402A through 402D of input data 402). In some examples, clock selection can proceed as follows. Knowing that each of the N phase-shifted-clock candidates 506A through 506H each are shifted in phase by a different multiple of T/N with respect to the reference clock, where T is the length of one cycle of the reference clock (e.g., the cycle beginning at time t0 and ending at time t1), it is known that each of 506A through 506H will include a rising edge at a different moment within a single cycle of the reference clock. That is, of N phase-shifted-clock candidates, a phase-shifted-clock candidate having an index i can include a rising edge at time t0+i*((t1−t0/N)). For example, if t0 is 10, t1 is 14, and N is 8, a phase-shifted-clock candidate with index 0 (e.g., corresponding to phase-shifted-clock candidate 506A) can include a rising edge at time 10+0* ((14−10)/8)=10. Similarly, a phase-shifted-clock candidate with index 1 (e.g., corresponding to phase-shifted-clock candidate 506B) can include a rising edge at time 10+1*((14−10)/8)=10.5; a phase-shifted-clock candidate with index 2 can include a rising edge at time 10+2*((14−10)/8)=11; and so on.

With the knowledge that each of the N phase-shifted-clock candidates can include a rising edge at an evenly spaced interval within a single cycle of the reference clock, it can be predicted that a half-cycle data pulse (e.g., data pulse 504, which may be presented along bus 150A as a bit of data input 402) will be captured by N/2 phase-shifted-clock candidates. That is, if a half-cycle data pulse is presented to N latches, with each latch gated by a respective one of the N phase-shifted-clock candidates, half of the N latches—those whose respective gates transitioned from low to high while the data pulse was high—will produce a logical one at their respective outputs. Furthermore, if the phase-shifted-clock candidates are ordered in sequence (that is, with each successive phase-shifted-clock candidate featuring a longer phase shift than the phase-shifted-clock candidate before it), the half-cycle data pulse can be captured by a contiguous group of phase-shifted-clock candidates. For instance, in FIG. 5, data pulse 504 is shown transitioning from low to high at time t0, and transitioning from high to low at the midpoint between time t0 and time t1 (from which point it remains low). In the example, the data pulse 504 would be captured by four of the eight phase-shifted-clock candidates: e.g., phase-shifted-clock candidates 506A through 506D, which correspond to the four phase-shifted-clock candidates that transition from low to high while data pulse 504 is high.

From the set of phase-shifted-clock candidates that capture the half-cycle data pulse 504, a preferred phase-shifted-clock candidate can be selected to be the lane clock. It may be desirable for the lane clock to capture data after it has arrived and stabilized—that is, after transients have settled and the data has entered a sufficiently stable state at the receiving block (e.g., 112) such that the data is guaranteed to be valid. It may further be desirable for the lane clock to capture data a significant temporal distance from either a rising edge or a falling edge of the data, in order to increase the tolerance to on-chip variation (OCV), jitter, temperature drift, and other sources of fluctuation in the data or clock signals. Various metrics can be used to identify the preferred phase-shifted-clock candidate, and thus select the lane clock, from the set of phase-shifted-clock candidates, according to these example criteria. In some embodiments, the lane clock may be selected to be the phase-shifted-clock candidate whose rising edge is closest to the middle of the reference clock cycle (that is, the phase-shifted-clock candidate whose phase shift, relative to the reference clock is closest to 180 degrees); this may be because, during normal device operation, the data will arrive in increments corresponding to full cycles of the reference clock, such that the phase-shifted-clock candidate whose rising edge is closest to the middle of the reference clock cycle may be the one that bests ensure data stability. In some embodiments, the lane clock may be selected to be the last phase-shifted-clock candidate of the group of phase-shifted-clock candidates that captures the half-cycle data pulse (i.e., the last phase-shifted-clock candidate before the midpoint of the reference clock cycle). In some embodiments, the lane clock may be selected to be the first phase-shifted-clock candidate following the group of phase-shifted-clock candidates that captures the half-cycle data pulse (i.e., the first phase-shifted-clock candidate after the midpoint of the reference clock cycle). In some embodiments, the lane clock may be selected to be any one of the phase-shifted-clock candidates of the group of phase-shifted-clock candidates that captures the data pulse.

The number N of phase-shifted-clock candidates can affect the accuracy of the lane clocks. The greater the value of N, the smaller the phase shift difference between two adjacent phase-shifted-clock candidates; and the greater likelihood that an ideal lane clock can be selected. However, increasing the number N of phase-shifted-clock candidates generally increases the time and the circuit complexity required to conduct the lane clock calibration process. The desired value of N may be selected by a designer depending on the requirements of the specific device at hand.

The above lane clock selection process can be repeated (sequentially or concurrently) for two or more of the K data bits of example data 402. For instance, the half-cycle data pulse 504 can be provided on a path corresponding to each bit of data 402 (e.g., data bits 402A through 402D), and for each bit, the best lane clock can be chosen from the N phase-shifted-clock candidates. Because the data travel time may differ somewhat between data bits, some phase-shifted-clock candidates may be better suited to certain data bits than to others. Selecting individual lane clocks, on a per-bit basis, and separately clocking each data bit 402A through 402D according to its respective lane clock, promotes the correct alignment of data bits entering memory 410 as described above.

In addition to selecting one or more lane clocks, the read clock (e.g., 432) can be selected from one of the phase-shifted-clock candidates 506A through 506H. As with the lane clocks, as described above, the selected read clock shares the frequency of the reference clock, but differs in phase. The read clock in the example can correspond to the phase-shifted-clock 130B described above with respect to FIG. 2; for instance, all components of the phase-shifted-clock domain 140B receiving data from phase-shifted-clock domain 140A can be synchronized to the selected read clock. To minimize noise effects described above—which may be amplified by resonance caused by synchronizing large portions of an electronic device to the same clock—a circuit designer may wish to select the read clock to be the phase-shifted-clock candidate that most differs in phase from other reference clocks and other phase-shifted-clocks of the device. This can help to minimize, to the extent possible, the degree to which transistor states toggle at the same time. For example, in a device in which many blocks of the device are synchronized to a reference clock, the read clock may be selected to be a phase-shifted-clock candidate with a half-cycle phase shift from the reference clock.

Similarly, in some examples, a write clock (e.g., 422) can be selected from one of the phase-shifted-clock candidates 506A through 506H. The write clock in the example can correspond to the phase-shifted-clock 130A described above with respect to FIG. 2; for instance, all components of the phase-shifted-clock domain 140A transmitting data to phase-shifted-clock domain 140B can be synchronized to the selected write clock. In some examples, a write clock can be selected according to a procedure analogous to that described above with respect to the read clock. In some examples, the write clock may simply be a buffered version of the reference clock (e.g., 130), or in some cases, may be the reference clock itself.

The designer may wish to avoid, to the extent possible, selecting phase-shifted-clocks that have a phase shift identical to that of a reference clock or phase-shifted-clock to which significant portions of the device are synchronized. By appropriately apportioning a digital device into phase-shifted-clock domains, and selecting phase-shifted-clocks for those phase-shifted-clock domains that are sufficiently different in phase, the resonance (and accompanying noise) created by transistors toggling in synchrony can be managed.

Figure 6:
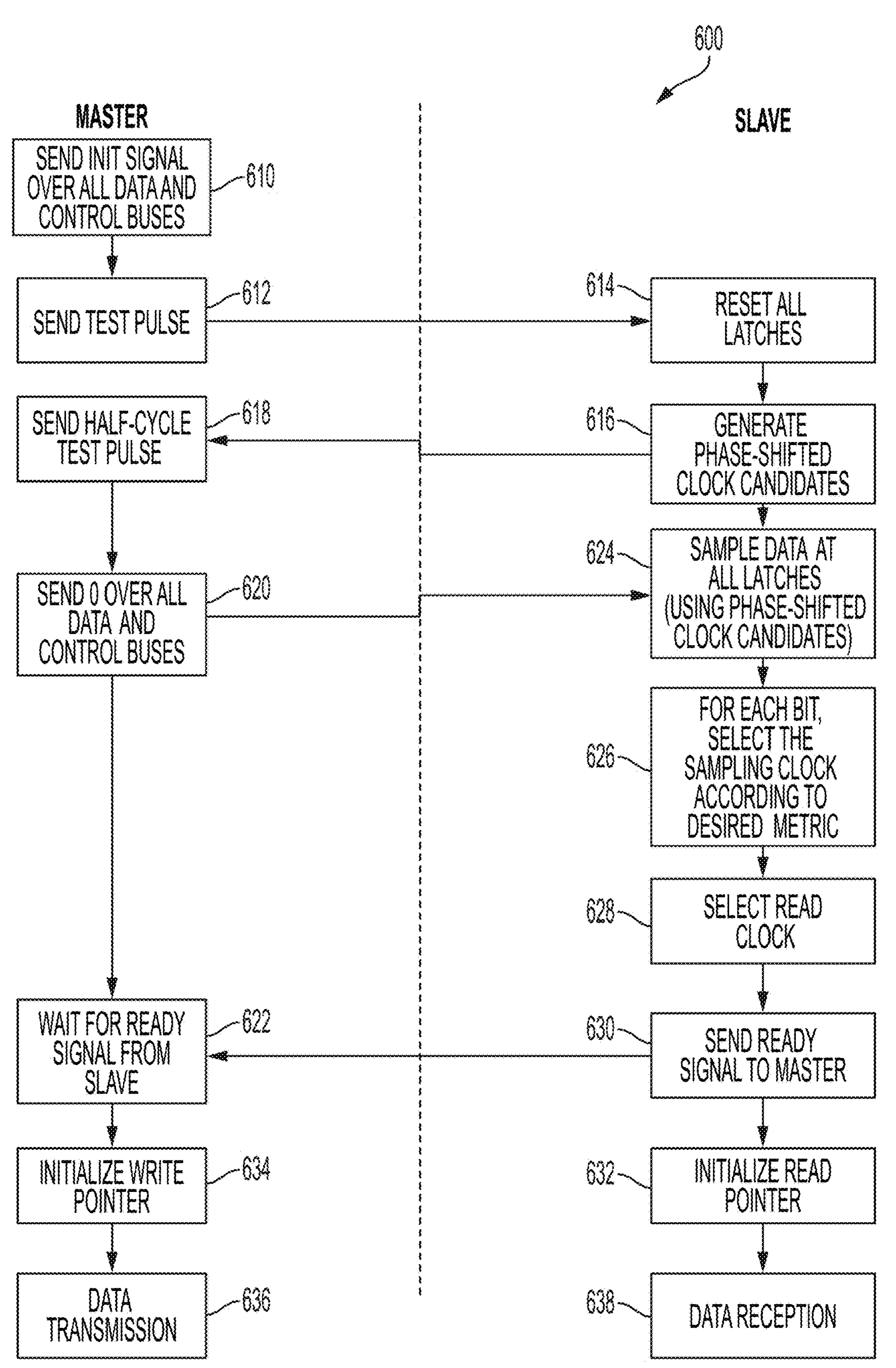
FIG. 6 illustrates a block diagram of an example process for configuring data transfer between two phase-shifted-clock domains of an electronic device, according to some embodiments.

FIG. 6 illustrates an example process 600 of configuring a device (e.g., device 100 described above) for transmitting data between a transmitting block associated with a first phase-shifted-clock domain (e.g., 140A) and a receiving block associated with a second phase-shifted-clock domain (e.g., 140B). In the example process shown, stages on the left side of the figure may correspond to steps performed by the "master" transmitting block (e.g., by asynchronous transfer module 310A described above), and stages on the right side of the figure may correspond to steps performed by the "slave" receiving block (e.g., by asynchronous receive module 312A described above). However, other suitable configurations are possible, and various steps of the example process may be performed by the transmitting block, by the receiving block, by circuitry separate from the transmitting block and the receiving block, or by any suitable combination of the above.

At stage 610, the master block can send an initialization signal over all data and control buses to initialize the phase-shift-clock selection and data transmission process. For example, this initialization signal could be logical zero on all data and control buses. At stage 612, the master block can send a test pulse (e.g., a two-clock-cycle pulse), causing all latches to reset at the slave block (stage 614).

At stage 616, the slave block can enter the lane clock selection phase described above; a DLL can generate the desired number of phase-shifted-clock candidates, as described above, with the phase-shifted-clock candidates provided as clock inputs to respective latches as described above. At stage 618, the master block can send a half-cycle data test pulse to the latches, followed by a logical low (stage 620), such as described above with respect to signal 504. The master block then waits for a ready signal from the slave (stage 622). Meanwhile, at stage 624, the latches of the slave block sample the data test pulse as described above. At stage 626, the slave block can select a preferred lane clock for each data bit, such as described above. Once the lane clocks have been selected, a read clock (e.g., corresponding to phase-shifted-clock 130B) is selected (stage 628) such as described above. (In some examples, a write clock, such as may correspond to phase-shifted-clock 130A, may also be selected as described above.)

After the lane clocks and the read clock have been selected, the slave block can send a ready signal to the master block (stage 630), indicating that the clocks have been selected and data transfer should begin. A read pointer (stage 632) and a write pointer (stage 634) for memory 410, such as shown above with respect to FIG. 4, can be initialized at this stage. It may be desirable for the read pointer and the write pointer to be initialized to values offset from each other, to avoid potential race conditions that can compromise the data integrity of the memory. Following the initialization of the read and write pointers, data transmission can begin on the master block (stage 636), and data reception can begin on the slave block (stage 638), such as described above.

Some embodiments disclosed herein are directed to an electronic device comprising: a first clock configured to operate at a frequency; first circuitry configured to synchronize with the first clock; second circuitry configured to determine a second clock based on the first clock, the second clock configured to operate at the frequency of the first clock and further configured to operate with a phase shift with respect to the first clock; and third circuitry configured to synchronize with the second clock. Additionally or alternatively to one or more of the embodiments disclosed herein, in some embodiments, determining the second clock comprises: generating a plurality of clock candidates, each clock candidate of the plurality of clock candidates configured to operate at the frequency of the first clock and further configured to operate with a respective phase shift with respect to the first clock; and selecting the second clock from the plurality of clock candidates. Additionally or alternatively to one or more of the embodiments disclosed herein, in some embodiments, the second clock is selected to be a clock candidate of the plurality of clock candidates that has a respective phase shift closest to 180 degrees. Additionally or alternatively to one or more of the embodiments disclosed herein, in some embodiments, the second clock is selected to reduce a transistor resonance of the electronic device. Additionally or alternatively to one or more of the embodiments disclosed herein, in some embodiments, the electronic device is an ASIC, the first circuitry corresponds to a first functional block of the ASIC, the second circuitry comprises a delay-locked loop, and the third circuitry corresponds to a second functional block of the ASIC. Additionally or alternatively to one or more of the embodiments disclosed herein, in some embodiments, the electronic device further comprises a memory, the electronic device is configured to perform a data write operation with respect to the memory, the data write operation synchronized to the first clock, and the electronic device is further configured to perform a data read operation with respect to the memory, the data read operation synchronized to the second clock. Additionally or alternatively to one or more of the embodiments disclosed herein, in some embodiments, the first circuitry is further configured to transmit data to the third circuitry. Additionally or alternatively to one or more of the embodiments disclosed herein, in some embodiments, the electronic device further comprises a data bus electronically coupled to the first circuitry and the third circuitry, the data bus comprising one or more wires including a first wire; the first circuitry is further configured to transmit the data to the third circuitry via the data bus; the electronic device further comprises one or more latches including a first latch, the first latch configured to receive the data via the first wire, the first latch configured to synchronize with a third clock determined based on the first clock; determining the third clock based on the first clock comprises: generating a plurality of clock candidates, each clock candidate of the plurality of clock candidates configured to operate at the frequency of the first clock and further configured to operate with a respective phase shift with respect to the first clock, and selecting the third clock from the plurality of clock candidates; and the third clock is selected from the plurality of clock candidates based on a latency between the first circuitry transmitting the data and the first latch receiving the data. Additionally or alternatively to one or more of the embodiments disclosed herein, in some embodiments, each latch of the one or more latches corresponds to a respective wire of the one or more wires and is configured to receive the data via the respective wire; each latch of the one or more latches is configured to synchronize with a respective clock selected from the plurality of clock candidates; and each respective clock is selected from the plurality of clock candidates based on a latency between the first circuitry transmitting the data and its respective latch receiving the data.

Some embodiments disclosed herein are directed to a method comprising, at an electronic device comprising a first circuitry, a second circuitry, and a third circuitry: synchronizing the first circuitry with a first clock operating at a frequency; determining a second clock based on the first clock, the second clock operating at the frequency of the first clock and further operating with a phase shift with respect to the first clock; and synchronizing the third circuitry with the second clock. Additionally or alternatively to one or more of the embodiments disclosed herein, in some embodiments, determining the second clock comprises: generating a plurality of clock candidates, each clock candidate of the plurality of clock candidates operating at the frequency of the first clock and further operating with a respective phase shift with respect to the first clock; and selecting the second clock from the plurality of clock candidates. Additionally or alternatively to one or more of the embodiments disclosed herein, in some embodiments, the second clock is selected to be a clock candidate of the plurality of clock candidates that has a respective phase shift closest to 180 degrees. Additionally or alternatively to one or more of the embodiments disclosed herein, in some embodiments, the second clock is selected to reduce a transistor resonance of the electronic device. Additionally or alternatively to one or more of the embodiments disclosed herein, in some embodiments, the first circuitry corresponds to a first functional block of an ASIC, the second circuitry comprises a delay-locked loop, and the third circuitry corresponds to a second functional block of the ASIC. Additionally or alternatively to one or more of the embodiments disclosed herein, in some embodiments, the method further comprises: in accordance with a transition of the first clock, performing a data write operation with respect to a memory of the electronic device; and in accordance with a transition of the second clock, performing a data read operation with respect to the memory. Additionally or alternatively to one or more of the embodiments disclosed herein, in some embodiments, the method further comprises transmitting data from the first circuitry to the third circuitry.

Some embodiments disclosed herein are directed to a method of transmitting data, the method comprising: synchronizing a first circuitry with a first clock operating at a frequency, the first clock associated with a first clock domain; determining a second clock based on the first clock, the second clock operating at the frequency of the first clock and further operating with a phase shift with respect to the first clock, the second clock associated with a second clock domain; synchronizing a second circuitry with the second clock, the second circuitry configured to receive data from the first circuitry via one or more latches electronically coupled to a data bus, the data bus comprising one or more wires including a first wire, the one or more latches including a first latch configured to receive the data via the first wire; generating a plurality of clock candidates, each clock candidate of the plurality of clock candidates configured to operate at the frequency of the first clock and further configured to operate with a respective phase shift with respect to the first clock; synchronizing the first latch with a third clock selected from the plurality of clock candidates; and transmitting the data from the first circuitry to the second circuitry via the data bus and the first latch. Additionally or alternatively to one or more of the embodiments disclosed herein, in some embodiments, the third clock is selected from the plurality of clock candidates based on a latency between the first circuitry transmitting the data and the first latch receiving the data. Additionally or alternatively to one or more of the embodiments disclosed herein, in some embodiments, each latch of the one or more latches corresponds to a respective wire of the one or more wires and is configured to receive the data via the respective wire, and the method further comprises: for each latch of the one or more latches, selecting a respective clock from the plurality of clock candidates based on a latency between the latch and the first circuitry transmitting the data, and synchronizing the latch to its respective clock.

Although the disclosed embodiments have been fully described with reference to the accompanying drawings, it is to be noted that various changes and modifications will become apparent to those skilled in the art. For example, elements of one or more implementations may be combined, deleted, modified, or supplemented to form further implementations. Such changes and modifications are to be understood as being included within the scope of the disclosed embodiments as defined by the appended claims.

The invention claimed is:

1. An electronic device comprising:

circuitry configured to:

receive a first clock, the first clock configured to operate at a frequency; and receive a second clock and a third clock, wherein:

the second clock is configured to operate at the frequency of the first clock and further configured to operate with a first phase shift with respect to the first clock, the third clock is configured to operate at the frequency of the first clock and further configured to operate with a second phase shift with respect to the first clock, and each of the second clock and the third clock is associated with a respective clock candidate selected from a plurality of clock candidates;

wherein:

each clock candidate of the plurality of clock candidates is associated with a respective phase shift relative to the first clock;

the selecting the respective clock candidate associated with the second clock from the plurality of clock candidates comprises comparing, for a first data bit of a plurality of data bits, a first respective phase shift to a transition edge of the first clock; and the selecting the respective clock candidate associated with the third clock from the plurality of clock candidates comprises comparing, for a second data bit of the plurality of data bits, a second respective phase shift to a transition edge of the first clock.

2. The electronic device of claim 1, wherein each clock candidate of the plurality of clock candidates is configured to operate at the frequency of the first clock.

3. The electronic device of claim 1, wherein the second clock is associated with a phase shift of 180 degrees.

4. The electronic device of claim 1, wherein the circuitry is further configured to synchronize with the first clock.

5. The electronic device of claim 1, wherein one or more of the respective clock candidates is selected to reduce a noise of the electronic device.

6. The electronic device of claim 5, wherein the noise is associated with transistor resonance.

7. The electronic device of claim 1, further comprising a memory, wherein:

the electronic device is configured to perform a data write operation with respect to the memory, the data write operation synchronized with the first clock, and the electronic device is further configured to perform a data read operation with respect to the memory, the data read operation synchronized with the second clock.

8. The electronic device of claim 1, further comprising a data bus electronically coupled to the first circuitry and electronically coupled to a second circuitry of the electronic device, wherein the first circuitry is further configured to transmit data to the second circuitry via the data bus, and wherein the second circuitry is configured to synchronize with the second clock.

9. The electronic device of claim 1, wherein:

the electronic device comprises one or more latches; and each latch of the one or more latches is configured to:

receive data from the circuitry, and synchronize with a respective clock selected from the plurality of clock candidates based on a latency between the latch and the circuitry.

10. The electronic device of claim 1, wherein:

the first clock is associated with a first portion of the circuitry, the second clock is associated with a second portion of the circuitry, the third clock is associated with a third portion of the circuitry, the first portion of the circuitry is distinct from the second portion of the circuitry and is further distinct from the third portion of the circuitry, and the second portion of the circuitry is distinct from the third portion of the circuitry.

11. A method, comprising:

receiving, at an electronic device, a first clock, the first clock operating at a frequency; and receiving, at the electronic device, a second clock and a third clock, wherein:

the second clock operates at the frequency of the first clock and operates with a first phase shift with respect to the first clock, the third clock operates at the frequency of the first clock and operates with a second phase shift with respect to the first clock, and each of the second clock and third clock is associated with a respective clock candidate selected from a plurality of clock candidates;

wherein:

each clock candidate of the plurality of clock candidates is associated with a respective phase shift relative to the first clock;

the selecting the respective clock candidate associated with the second clock from the plurality of clock candidates comprises comparing, for a first data bit of a plurality of data bits, a first respective phase shift to a transition edge of the first clock; and the selecting the respective clock candidate associated with the third clock from the plurality of clock candidates comprises comparing, for a second data bit of the plurality of data bits, a second respective phase shift to a transition edge of the first clock.

12. The method of claim 11, wherein the each clock candidate of the plurality of clock candidates is operating at the frequency of the first clock.

13. The method of claim 11, wherein the second clock is associated with a phase shift of 180 degrees.

14. The method of claim 11, further comprising synchronizing circuitry of the electronic device with the first clock.

15. The method of claim 11, wherein one or more of the respective clock candidates is selected to reduce a noise of the electronic device.

16. The method of claim 15, wherein the noise is associated with transistor resonance.

17. The method of claim 11, further comprising:

performing a data write operation with respect to a memory of the electronic device, the data write operation synchronized with the first clock, and performing a data read operation with respect to the memory, the data read operation synchronized with the second clock.

18. The method of claim 11, further comprising:

receiving data via a latch; and synchronizing with a respective clock selected from the plurality of clock candidates based on a latency between the latch and a circuitry of the electronic device.

19. The method of claim 11, wherein:

the first clock is associated with a first portion of circuitry of the electronic device, the second clock is associated with a second portion of the circuitry, the third clock is associated with a third portion of the circuitry, the first portion of the circuitry is distinct from the second portion of the circuitry and is further distinct from the third portion of the circuitry, and the second portion of the circuitry is distinct from the third portion of the circuitry.

20. A non-transitory computer-readable medium storing instructions which, when executed by one or more processors, cause the one or more processors to perform a method comprising:

receiving, at an electronic device, a first clock, the first clock operating at a frequency; and receiving, at the electronic device, a second clock and a third clock, wherein:

the second clock operates at the frequency of the first clock and operates with a first phase shift with respect to the first clock, the third clock operates at the frequency of the first clock and operates with a second phase shift with respect to the first clock, and each of the second clock and the third clock is associated with a respective clock candidate selected from a plurality of clock candidates;

wherein:

each clock candidate of the plurality of clock candidates is associated with a respective phase shift relative to the first clock;

the selecting the respective clock candidate associated with the second clock from the plurality of clock candidates comprises comparing, for a first data bit of a plurality of data bits, a first respective phase shift to a transition edge of the first clock; and the selecting the respective clock candidate associated with the third clock from the plurality of clock candidates comprises comparing, for a second data bit of the plurality of data bits, a second respective phase shift to a transition edge of the first clock.

* * * * *